(12) United States Patent
Miesak et al.

(10) Patent No.: US 7,949,022 B2
(45) Date of Patent: May 24, 2011

(54) DIODE PUMPING OF A LASER GAIN MEDIUM

(75) Inventors: Edward J. Miesak, Windermere, FL (US); Paul E. Jackson, Longwood, FL (US); Pei-Luen Li, Longwood, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 583 days.

(21) Appl. No.: 11/411,901

(22) Filed: Apr. 27, 2006

(65) Prior Publication Data
US 2007/0253458 A1    Nov. 1, 2007

(51) Int. Cl.
*H01S 3/04* (2006.01)
(52) U.S. Cl. .......... 372/35; 372/36; 372/34; 372/75
(58) Field of Classification Search .......... 372/75, 372/34, 35, 36
See application file for complete search history.

(56) References Cited

U.S. PATENT DOCUMENTS

| | | | |
|---|---|---|---|
| 3,684,980 A * | 8/1972 | Kay | 372/66 |
| 3,711,789 A * | 1/1973 | Dierschke | 372/75 |
| 4,847,851 A | 7/1989 | Dixon | |
| 4,924,474 A * | 5/1990 | Yagi et al. | 372/75 |
| 4,953,166 A * | 8/1990 | Mooradian | 372/21 |
| 5,311,528 A * | 5/1994 | Fujino | 372/35 |
| 5,488,619 A * | 1/1996 | Injeyan et al. | 372/12 |
| 5,651,021 A | 7/1997 | Richard et al. | |
| 5,889,808 A * | 3/1999 | Kojima et al. | 372/75 |
| 5,898,211 A | 4/1999 | Marshall et al. | |
| 5,913,108 A | 6/1999 | Stephens et al. | |
| 5,949,805 A * | 9/1999 | Mordaunt et al. | 372/34 |
| 5,982,802 A * | 11/1999 | Thony et al. | 372/75 |
| 6,061,378 A * | 5/2000 | Marshall et al. | 372/75 |
| 6,157,663 A | 12/2000 | Wu et al. | |
| 6,760,351 B1 * | 7/2004 | Riley et al. | 372/35 |
| 2003/0193982 A1 * | 10/2003 | Farahi et al. | 372/75 |

OTHER PUBLICATIONS

Brian J. Comaskey et al., IEEE Journal of Quantum Electronics, vol. 28, No. 4, Apr. 1992, pp. 992-996.
Friel et al., "High Average Power CW Face Pumping of a Nd:YAG planar waveguide laser with diode bars," IEEE Conference on Lasers and Electro-Optics, Europe, Sep. 2000.

* cited by examiner

*Primary Examiner* — Minsun Harvey
*Assistant Examiner* — Joshua King
(74) *Attorney, Agent, or Firm* — Birch, Stewart, Kolasch & Birch, LLP (57) ABSTRACT

An integrated, low profile, high power laser light emission device is disclosed. The integrated laser light emission device provides uniform heat dissipation, as well as uniform pumping of the laser gain medium without the need for a pumping cavity. The laser system includes a pump diode array that can be mounted directly to a laser gain medium without intervening correcting optics hardware. Heat generated by the laser light emission device is cooled by a single cooling system. In the laser device, a pump diode array is preferably a Vertical-Cavity Surface-Emitting Laser (VCSEL) array. VCSEL arrays are mounted on the laser gain crystal by a metal cavity frame or metal stilts. The slightly elevated mounting of the VCSEL's enables increased cooling and maximizing the quantity of VCSEL's on the laser gain medium in order to achieve highly efficient and high power laser light output.

9 Claims, 11 Drawing Sheets

DIODE PUMPING OF A LASER GAIN MEDIUM

BACKGROUND OF THE INVENTION

1. Field of the Invention (Technical Field)

The present invention relates generally to high power lasers and in particular to integrated high power diode pumped laser devices.

2. Description of Related Art

There are generally two types of semiconductor lasers. Edge-emitting lasers propagate laser light parallel to the wafer surface of the semiconductor chip and reflect the light out at a cleaved edge. Surface-emitting lasers propagate light in the direction perpendicular to the semiconductor wafer surface. Edge-emitting lasers are the most widely used form of semiconductor laser. They are capable of obtaining an output with high output power, although they require correction for poor beam quality.

A laser is typically composed of an active laser medium and a resonant optical cavity. The active laser medium, also referred to as a gain medium, is a material of a specific purity, size and shape which amplifies the beam. The gain medium must be pumped by an external energy source, such as another laser. The resonant cavity contains a coherent beam of light between reflective surfaces such that each photon passes through the gain medium multiple times before being emitted from the output aperture or lost to diffraction or absorption.

Rare-earth metals are predominately used to dope a crystal in forming a laser gain medium. Example doped crystal useable in gain media include ytterbium-doped yttrium aluminum garnet (Yb:YAG). Ytterbium has been attractive for laser crystals because of its small quantum defect allowing for very high power efficiencies, as well as large gain bandwidth. Other rare-earth metals used in doped crystal include neodymium and erbium.

The resonate cavity, or optical cavity, includes an arrangement of mirrors, typically two facing flat mirrors or spherical mirrors. When a wave that is resonant with the cavity enters, it bounces back and forth within the cavity, with low loss. As more wave energy enters the cavity, it combines with and reinforces the standing wave and increases its intensity.

Laser diodes can be used to pump laser gain media, referred to as a pump laser. The output of a typical semiconductor laser diode diverges almost immediately on exiting the aperture, at an angle that may be as high as 50 degrees. A perfectly collimated beam cannot be created because of diffraction. Thus, typically a divergent beam is transformed into a collimated beam by means of a lens.

High power lasers have been produced using edge-emitting lasers. Edge-emitting lasers are arranged into compact bars, and an array of bars can be arranged into a stack. These small self-contained high power stacks are available as a packaged laser device. The high power stacks offer efficient cooling, and high output power per bar. Packages consisting of high power stacks of laser diode bars are particularly useful for applications such as laser welding, heat-treating, brazing, and laser sintering.

Figure 7:
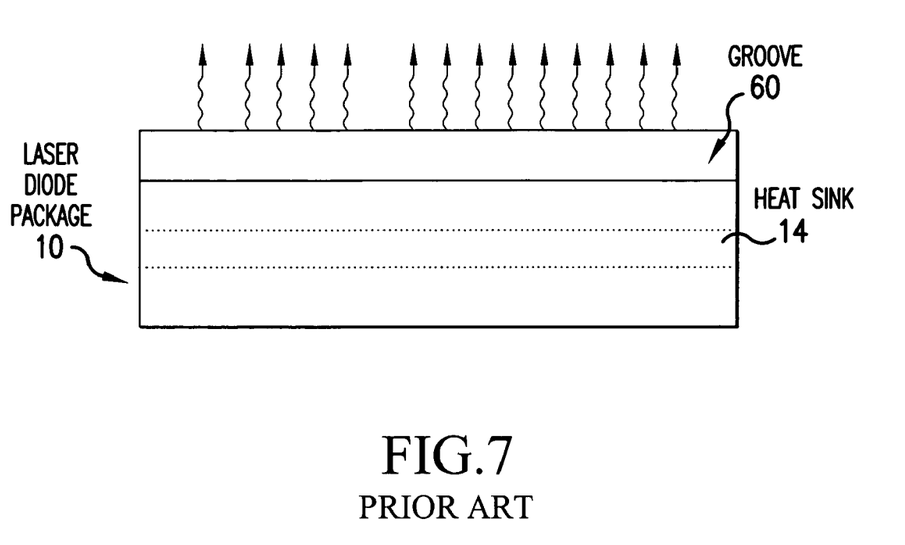
FIG. 7 is a conventional edge emitting diode bar.
Figure 8:
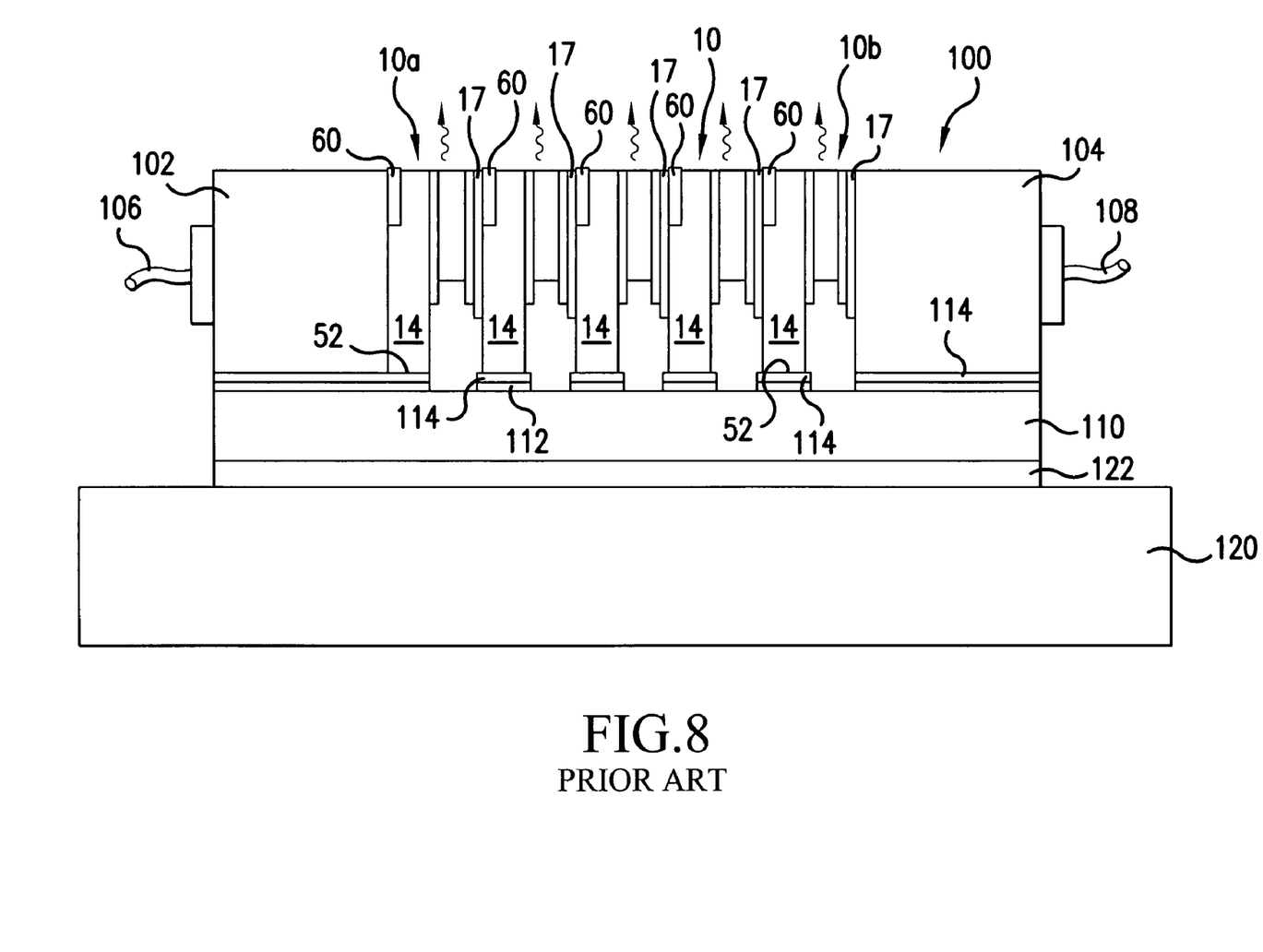
FIG. 8 is a structure for conventional high power stacks.

Examples of packaged high power stacks of laser diode bars are disclosed in U.S. Pat. No. 5,898,211 to Marshall et al., entitled "Laser Diode Package with Heat Sink." Marshall discloses arrangements where a plurality of laser diode bars are grouped together to form an array. FIG. 7 illustrates an example embodiment of an edge emitted laser diode bar, referred to as "laser diode package" 10. The package 10 includes an associated heat sink 14. FIG. 8 illustrates an example embodiment of an assembly having an array of laser diode bars. A laser diode array 100 includes a plurality of laser diode bars 10 arranged in substantially parallel configuration. A heat sink 14 of each of the laser diode bars 10 is bonded to a backplane 110 which is further attached to a thermal reservoir 120. The laser diode packaging arrangement of Marshall is self-contained and has its own cooling system.

An example laser having a laser diode pumping a laser gain medium is disclosed in U.S. Pat. No. 4,847,851 to Dixon, entitled "Butt-Coupled Single Transverse Mode Diode Pumped Laser." Dixon discloses a solid state laser that is optically pumped by a semiconductor diode. The output facet of the pumping diode is butt-coupled to the input facet of the pumping diode of the laser gain medium. Dixon discloses embodiments wherein the pumping diode and the input facet of the laser gain medium may be bonded together by a suitable optical adhesive, resulting in a device of reduced size.

In a preferred embodiment, Dixon discloses diode pump fixedly secured to a mounting member of copper and in turn to a mounting block. The laser gain medium is secured to the mounting block. The mounting blocks are maintained at a desired temperature by a thermal electric cooler. A hot face of the cooler is mounted to a heat sink.

U.S. Pat. No. 5,651,021 to Richard et al., entitled "Diode Pumped Slab Laser," discloses an alternative diode pumped slab laser, including embodiments for 3-bar stack diodes. Because pumped operation results in astigmatic focusing, Richard et al. discloses that improved matching between pump and mode at high inputs can be achieved by using a concave totally reflecting mirror.

U.S. Pat. No. 6,157,663 to Wu, et al., entitled "Laser with Optimized Coupling of Pump Light to a Gain Medium in a Side-Pumped Geometry," discloses, as an alternative to an end-pumped configuration, a solid-state laser that includes a high-absorption coefficient solid-state gain medium that is side pumped with a semiconductor laser diode array. Wu et al. discloses a preferred arrangement for side pumping the gain medium. Wu et al. discloses spacing between the pump laser and the gain medium that is greater than the conventional butt coupling configuration. The spacing is chosen to optimize coupling into a $TEM_{00}$ mode having a fixed position within the gain medium. In other words, the spacing is selected to maximize output power from the particular mode. Wu et al. discloses an embodiment wherein the semiconductor laser and the gain medium may be mounted on the same block and cooled together, e.g., copper block.

It has been proposed to use the high power stack packages to pump a slab laser (Comaskey et al., "High Average Power Diode Pumped Slab Laser," IEEE J. Quant Elec., Vol. 28, No. 4, April 1992). In particular, Comaskey describes a diode pumped slab laser having edge emitting diode bars face pumping one side of a YAG slab. The high power stacks are used to face pump the planar waveguide in order to obtain a laser of high average power. A cylindrical glass rod concentrates each line source emission into the center of the slab.

Figure 9:
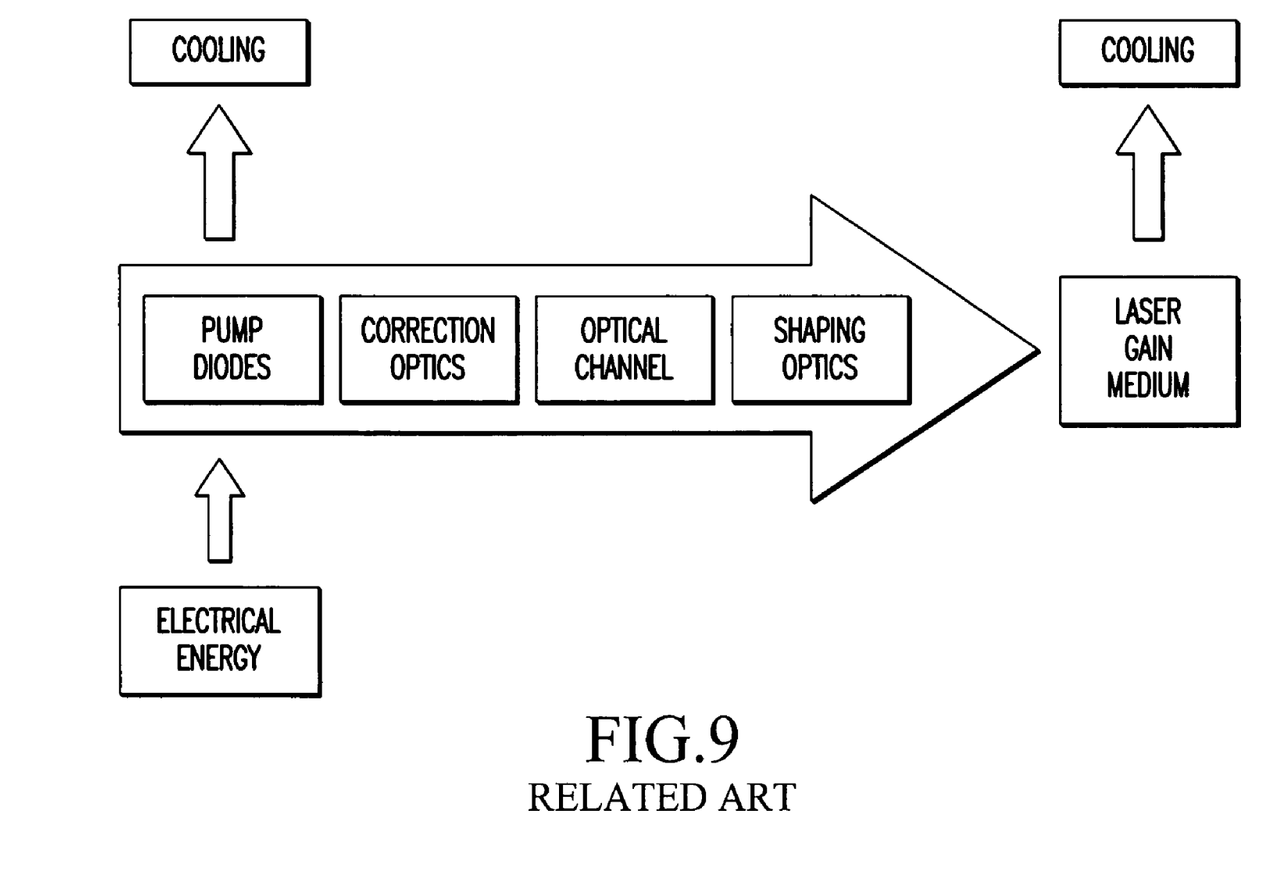
FIG. 9 is a block diagram for a conventional high power stack pumped laser device.

However, packaged high power lasers having high power stacks of edge emitting diode bars have several disadvantages. Light output from edge emitters is highly astigmatic. The light becomes highly divergent upon emission from the diode surface. Lenses are required for reduced divergence. Also, emitted light from edge emitting diodes is elliptical in shape. In order to obtain a circular shape, beam shaping optics is required. Furthermore, the high power stacks and laser waveguide, each being their own separate package each have their own independent cooling systems. FIG. 9 shows high power stacks of edge emitting diode bars with the laser gain medium and necessary optics hardware including correction optics, an optical channel, and shaping optics.

Figure 10:
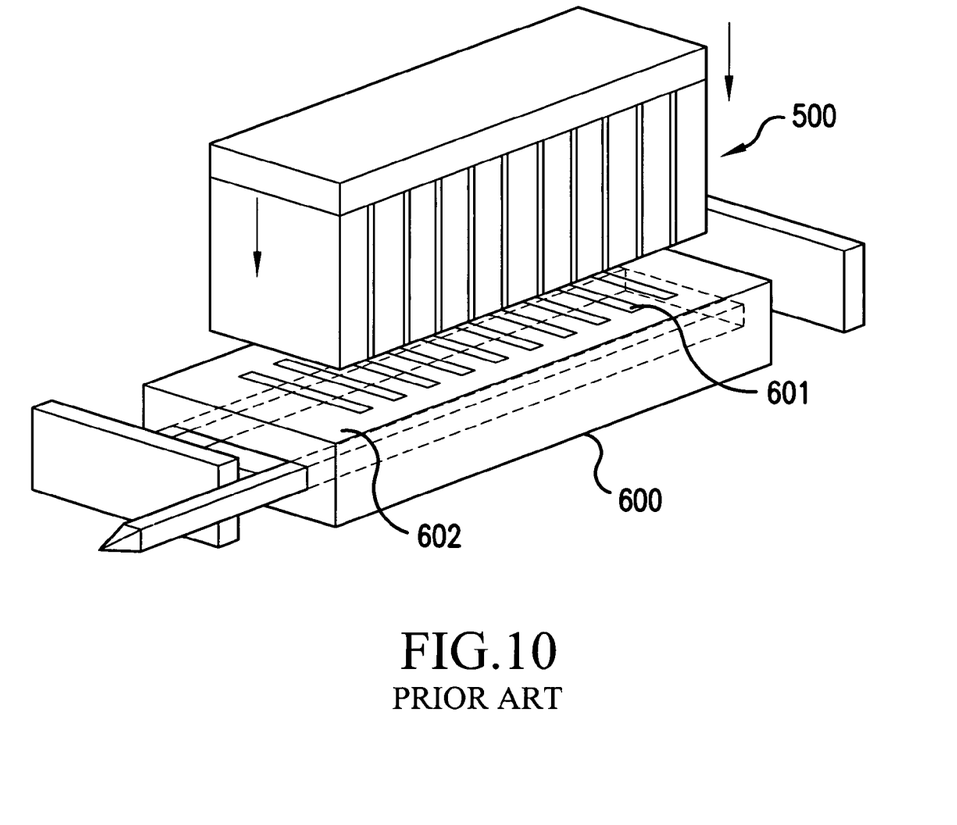
FIG. 10 is a schematic for a conventional high power planar waveguide laser.

An approach has been suggested that feeds light into a pumping chamber with fewer required intervening optics hardware (Friel, et al., "High average power cw face pumping of a Nd:YAG planar waveguide laser with diode bars," IEEE Conference on Lasers and Electro-Optics Europe, September 2000). As shown in FIG. 10, a stack of diode bars 500 face pump lasers that are guided into a slotted mirror pump chamber 600. The diode bars are positioned very close to the precision array of slots 601 of very small width in the top of the pump mirror 602 to guide radiation into the pump chamber 600. The natural divergence of the diode bars leads to high uniformity. However, because of the natural divergence of the diode bars, the slotted mirror 602 is required between the diode bars and the waveguide laser.

Furthermore, in the case of an edge emitting diode the output facet of an edge emitter is fragile and cannot touch another surface. Consequently, the sensitive output face needs to be protected.

BRIEF SUMMARY OF THE INVENTION

The present invention provides a solution to the above stated problems associated with high power laser devices, and in particular packaged high power stacks assembled to laser resonators. An aspect of the present invention is a scalable and integrated high power laser device. An integrated high power laser device provides semiconductor surface-emitting diode pump laser arrays mounted to laser gain medium. Aspects of the integrated high power laser include scaling to higher power while providing an efficient cooling system, along with uniform pumping of a laser gain medium. Aspects of the integrated high power laser eliminate optical hardware including correction optics. A cooling system can be a single cooling system that cools both the diode pump lasers and laser gain medium. The integrated high power laser affords a capability of operating as a monolithic block.

In particular, an integrated laser light emission system in embodiments of the present invention include a laser gain medium having at least one exposed surface, and a plurality of semiconductor laser diode arrays mounted to the laser gain medium and aligned with an exposed surface of the laser gain medium, wherein intervening correcting optical elements are contained between the semiconductor laser arrays and the laser gain medium, and wherein an area of the exposed surface of the laser gain medium is greater than the cross section dimension of the light beam emitted by a semiconductor laser diode array.

An integrated laser light emission device is provided that is capable of uniform pumping of the laser gain medium. An integrated laser light emission device generates laser light of high power without optical elements such as correcting optics. An integrated laser light emission device is provided as a monolithic unit including a plurality of semiconductor laser diode arrays mounted to a laser gain medium.

An integrated laser light emission device in embodiments of the present invention include semiconductor laser diodes within the semiconductor laser diode arrays that are pump diodes that emit laser light perpendicular to the at least one exposed surface of the laser gain medium, the at least one exposed surface being a top or bottom surface, wherein laser light is output from a side surface, different from the top or bottom surface of the laser gain medium.

An integrated laser light emission device is provided that is capable of scaling to higher power by additional semiconductor laser diode arrays and/or greater number of semiconductor laser diodes within the semiconductor laser diode arrays.

An integrated laser light emission device in embodiments of the present invention can include a single cooling system for both the laser gain medium and the semiconductor laser diode arrays.

An integrated laser light emission device is provided that is capable of efficient cooling by a single cooling system.

An integrated laser light emission device in embodiments of the present invention provide pump diodes as vertical-cavity surface-emitting lasers.

An integrated laser light emission device is provided in which light output from the semiconductor laser diode array is well behaved, eliminating the need for correction optics. The semiconductor laser diode array being a vertical-cavity surface-emitting laser does not require special coating.

An integrated laser light emission device in embodiments of the present invention provide the laser gain medium and plurality of semiconductor laser diode arrays as a single semiconductor chip for outputting laser light.

An integrated laser light emission device is provided that is capable of operation as a monolithic device. Manufacturing of high power laser devices of various scales is simplified.

An integrated laser light emission device in alternative embodiments of the present invention include semiconductor laser diode arrays mounted on each of opposing top and bottom surfaces of the laser gain medium in a staggered arrangement. The staggered arrangement is such that the space between each adjacent pair of semiconductor laser diode arrays on the top surface is substantially covered by a semiconductor laser diode array on the bottom surface of the laser gain medium.

The integrated laser light emission device in alternative embodiments of the present invention include semiconductor laser diode arrays that are junction-down mounted to the laser gain medium via a metal cavity frame.

The alternative embodiments of the integrated laser light emission device are capable of additional heat dissipation for heat generated by the laser gain medium. The increase in heat dissipation enables a greater number of semiconductor laser diode arrays to be mounted on the surface of the laser gain medium.

The integrated laser light emission device in alternative embodiments of the present invention include semiconductor laser diode arrays that are junction-down mounted to the laser gain medium, providing a gap between the respective semiconductor laser diode array and laser gain medium for coolant to flow in the gap.

The alternative embodiments of the integrated laser light emission device are capable of additional coolant flow in order to provide efficient cooling of opposing top and bottom surfaces of the laser gain medium. The increase in cooling flow enables a greater number of semiconductor laser diode arrays to be mounted to the surface of the laser gain medium.

The integrated laser light emission device in alternative embodiments of the present invention include a laser gain medium without a pump cavity and the laser diode arrays are directly mounted to the laser gain medium.

An integrated light emission device is provided having uniform heat dissipation, as well as uniform pumping of the laser gain medium without an additional pump cavity element. A compact high power integrated laser light emission device is provided.

The integrated laser light emission device in alternative embodiments of the present invention include a single cooling system that provides coolant flow in a gap between the semiconductor laser diode arrays and laser gain medium.

The alternative embodiments of the integrated laser light emission device are capable of additional coolant flow in order to provide efficient cooling of opposing top and bottom surfaces of the laser gain medium.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
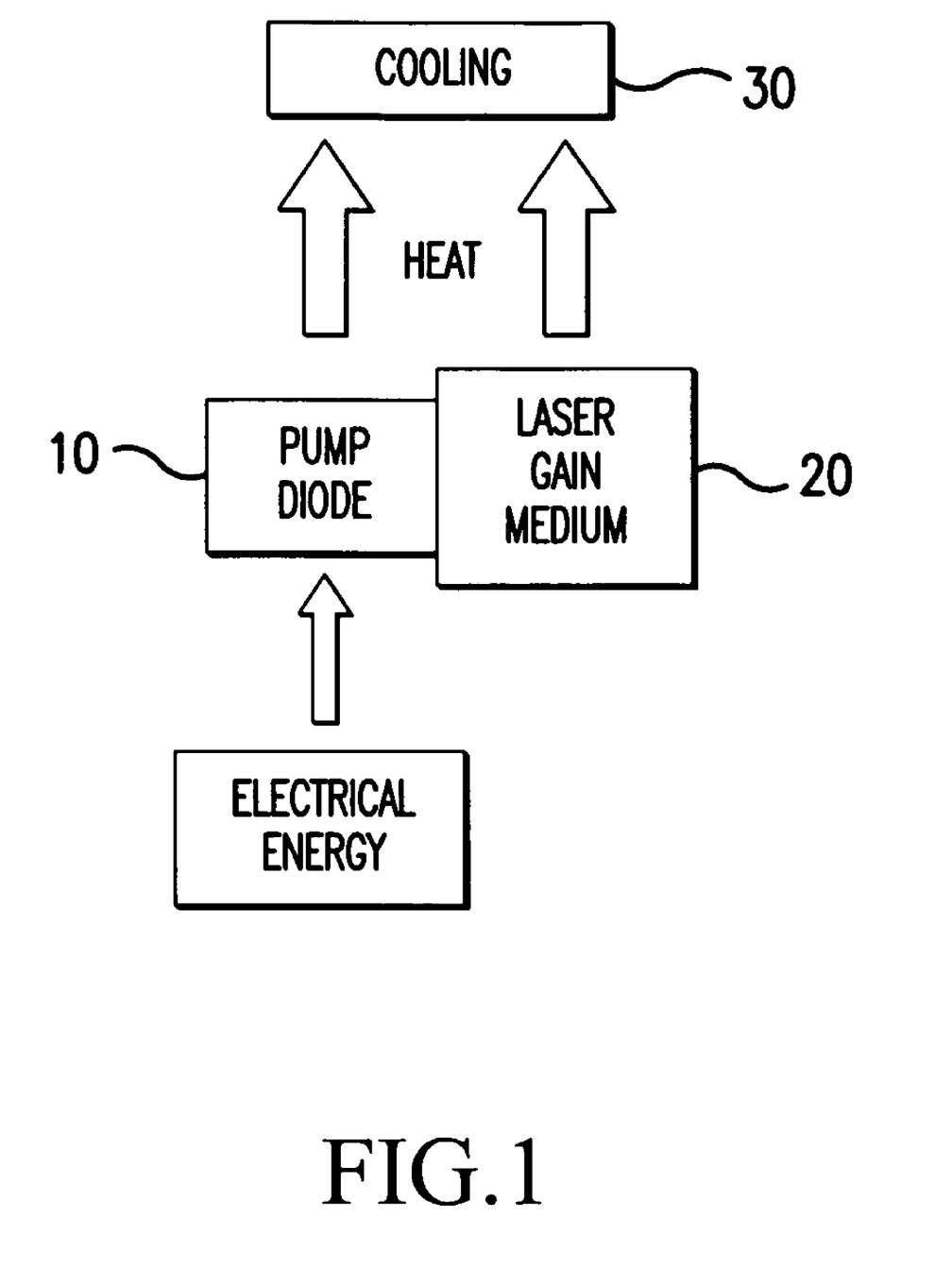
FIG. 1 is a block diagram for a light emitting system.

Preferred embodiments of the present invention provide an integrated, low profile, high power laser device. FIG. 1 illustrates a general block diagram laser system that includes a pump diode array 10 mounted to a laser gain medium 20. Heat generated by both the pump diode array 10 and laser gain medium 20 are cooled by a single cooling system 30.

Figure 2A:
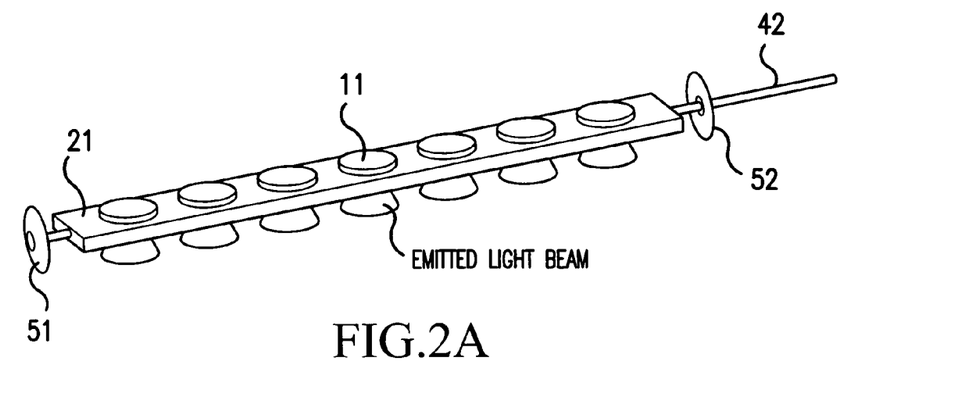
FIGS. 2A and 2B show views of a first embodiment of a high power laser light system.
Figure 2B:
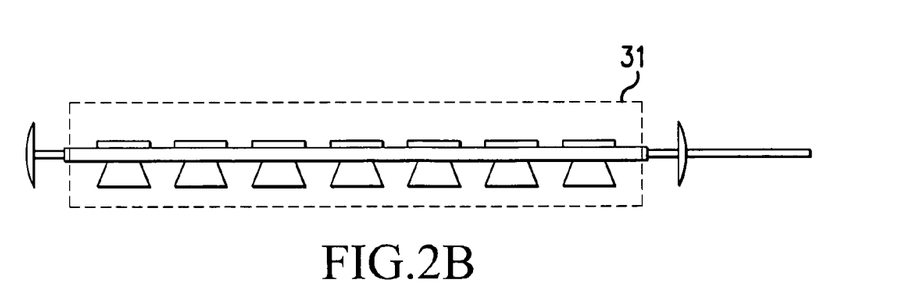

FIGS. 2A and 2B show views of a first preferred embodiment of the laser light emission device. In the preferred embodiment of the laser light emission device, a pump diode array is a Vertical-Cavity Surface-Emitting Laser (VCSEL) array 11. A Vertical-Cavity Surface-Emitting Laser (VCSEL) is a type of semiconductor laser diode with a laser beam emission perpendicular from the top surface. The laser gain medium is preferably a laser gain crystal 21, such as ytterbium-doped yttrium aluminum garnet (referred to as a YAG-slab). Aside from the laser gain crystal 21, a laser resonator also includes two opposing end mirrors 51, 52. One mirror is located at a free end of the laser gain crystal. Another mirror is located at an output end of the laser gain crystal 21. The mirrors 51, 52 can be either flat or spherical. Light is provided at an output 42 at the output end of the laser gain crystal. A side of the laser gain crystal 21 is blanketed with VCSEL arrays mounted on the laser gain crystal. As shown in FIG. 2B, a cooling system 30 provides coolant that flows in an area 31 passing over the top surface of the laser gain crystal having VCSEL arrays and the opposite bottom surface without arrays. The coolant is preferably water provided at 60 psi, and is preferably provided at a flow rate to prevent boiling over the range of operational power. Any of available coolants that prevent boiling over the range of operational power are preferably used.

VCSEL arrays are junction-down mounted on, and slightly elevated from, the laser gain crystal.

Figure 3:
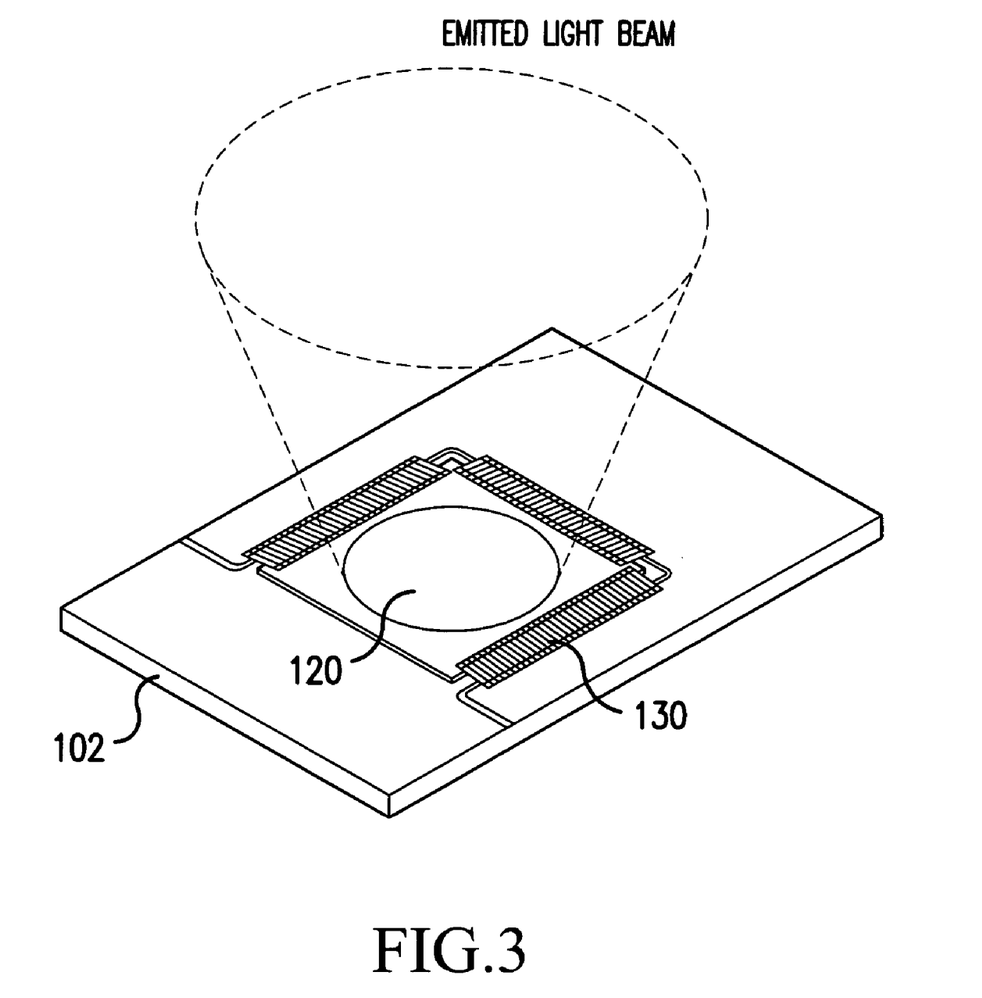
FIG. 3 is a perspective view of a vertical-cavity surface-emitting laser array.

FIG. 3 illustrates a preferred arrangement for a vertical-cavity surface-emitting laser array, a VCSEL array 11 of FIG. 2. A chip includes a circular light emitting area 120 in which the laser beam is emitted perpendicular from the top surface. The emitted light beam has low divergence and maintains a circular shape. In an implementation of the preferred embodiment, the light emitting area can be 4.5 mm diameter and emit 80 W, with beam divergence of 15 to 20 degrees, and wall plug efficiency of 30%. The VCSEL array is preferably formed on a diamond submount 102 in order to dissipate heat. Wiring 130 for the array is located in the periphery of the emitting area.

The arrangement in a first preferred embodiment provides an architecture that facilitates scaling-up to large output powers. The scale can be increased by adding a greater number of VCSEL arrays and/or by mounting larger VCSEL arrays (i.e., a VCSEL having a greater number of laser devices).

The single monolithic device preferably has a simplified cooling system, which uses one common cooling system. As an alternative to providing coolant flow over both side of the laser gain medium slab having the tiled arrangement of VCSEL arrays and the side of the slab not having the arrays, coolant flow can be made only on one side of the laser gain crystal slab that does not have the arrays. Using an arrangement having coolant flow on one side directs heat transfer from the VCSEL arrays through the laser gain crystal slab, and enables mounting of a greater number of the VCSEL arrays on one side of the slab. The laser system provides uniform pumping of the slab and high output power.

Figure 4:
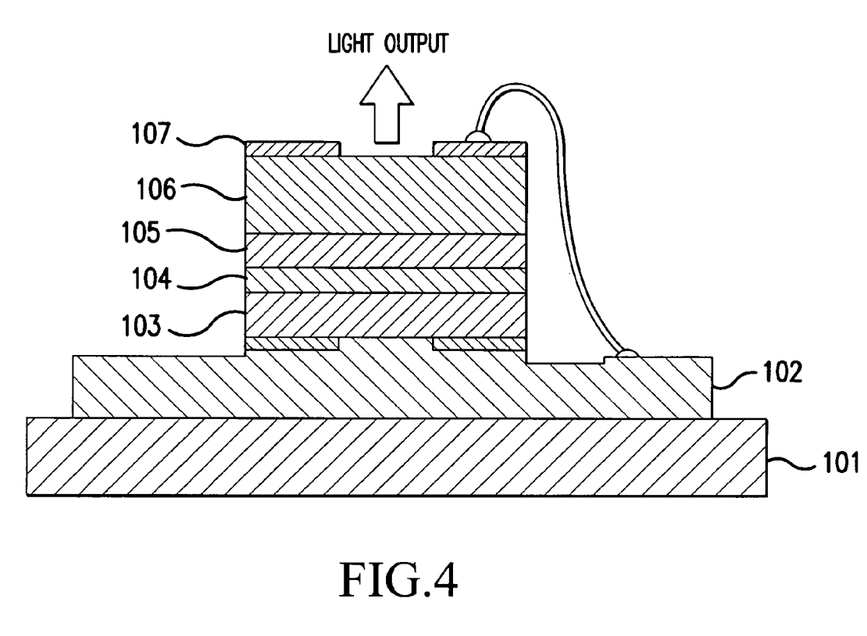
FIG. 4 is structural side view of a vertical-cavity surface-emitting laser.

FIG. 4 illustrates a preferred structure of a VCSEL. As mentioned above, a diamond submount 102 serves as a heat spreader to dissipate heat. An active region 104 is sandwiched between two Bragg reflectors 103, 105. A metal contact 107 is formed on a substrate 106, as the upper layer of the semiconductor device. Laser light is output from the upper substrate layer. The diamond submount 102 is preferably formed on a copper carrier 101. The Bragg reflector 103, diamond submount 102 and copper carrier 101 provide high thermal conductivity, low electrical resistance, and high reflectivity. VCSEL's can be diced into single laser devices or 2-D arrays.

Figure 5A:
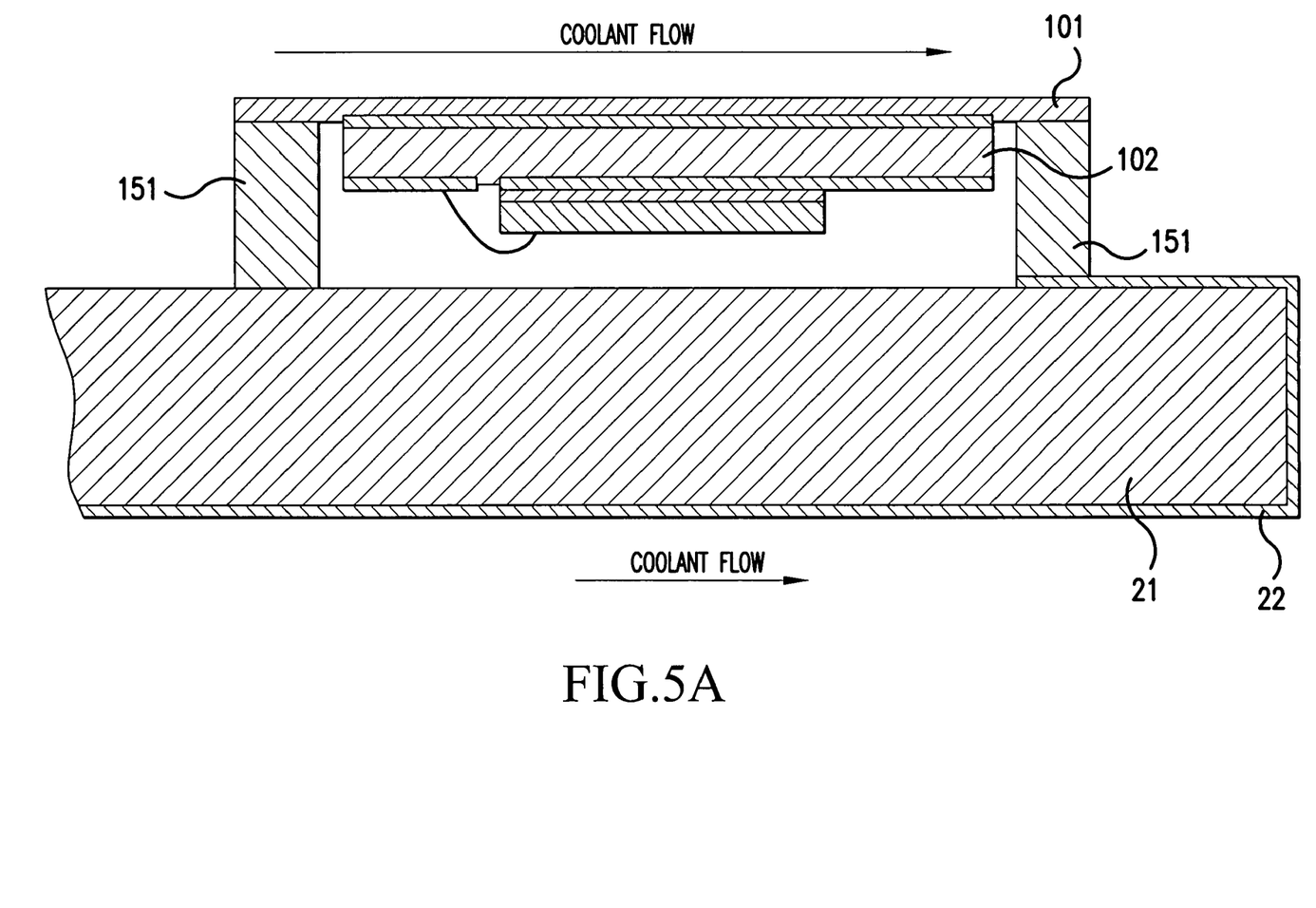
FIGS. 5A and 5B show a second embodiment of a high power laser light system having an elevated laser array.

In a second preferred embodiment, VCSEL arrays are mounted to the laser gain medium by a window-frame-type mounting, in alignment with an exposed area on the surface of the laser gain medium. As can be seen in FIG. 5A, the VCSEL array can be mounted by using a metal cavity frame 151, preferably made of copper. The metal cavity frame 151 elevates the VCSEL array above a surface of the laser gain medium, but prevents coolant from flowing over the light emitting portion, junction and wiring of the VCSEL. The metal cavity frame 151 is mounted on one edge to the copper carrier 101 and on the opposite edge to the surface of the laser pump cavity 22 by a conductive adhesive. In the absence of a laser pump cavity, the metal cavity frame 151 can be mounted directly to the surface of the laser gain medium. In either case, it is preferable that an area of exposed laser gain medium be at least the size of the laser beam cross section emitted by the respective VCSEL array. The sufficiently large exposed area of the laser gain medium insures that the laser beam emitted by the respective VCSEL array can provide pumping of the laser gain medium in an unchecked state. The laser light provided in the laser gain medium is uniformly pumped with low loss within the gain medium, providing an output of the laser gain medium at high power. Furthermore, high power can be achieved without a pump cavity.

Figure 5B:
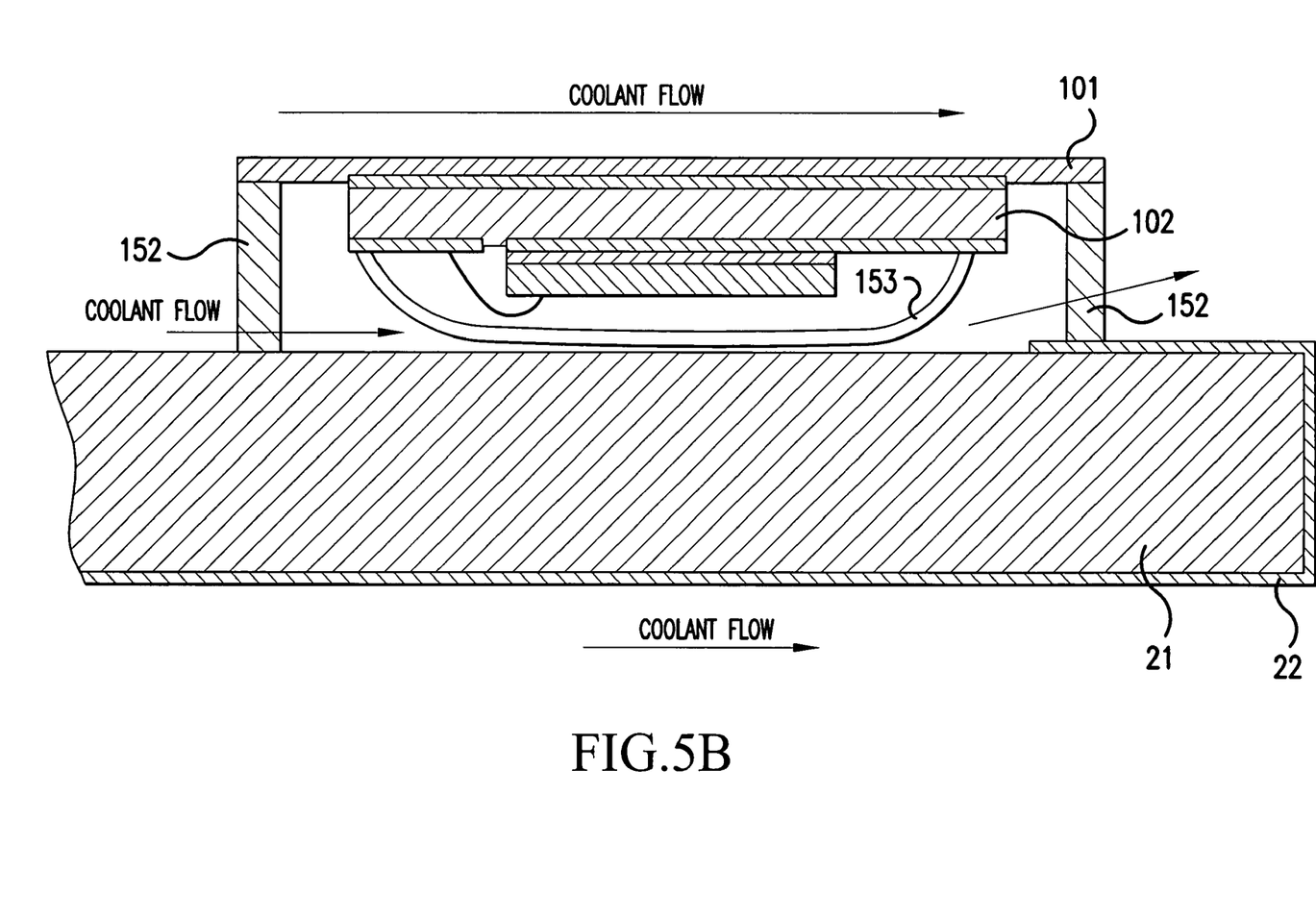

In a third preferred embodiment, the mounting of the VCSEL array to the laser gain crystal can be made by metal stilts 152 connecting the copper carrier 101 to the outer surface of the pump cavity 22. A gap is provided between the VCSEL array and the laser gain medium that is sufficient to allow coolant to flow. As shown in FIG. 5B, a low-loss diffuser plate 153, preferably a sapphire plate, may be formed to hermetically seal the output, junction and associated wiring of the VCSEL. A coolant flow stream can be provided within the gap formed between the diffuser plate and the exposed surface of the laser gain medium to provide coolant flow over both opposing sides of the laser gain medium. Subsequently, a greater number of VCSEL arrays can be provided on the laser gain crystal than can be provided for the second preferred embodiment. Thus, an even higher power can be achieved.

Figure 6A:
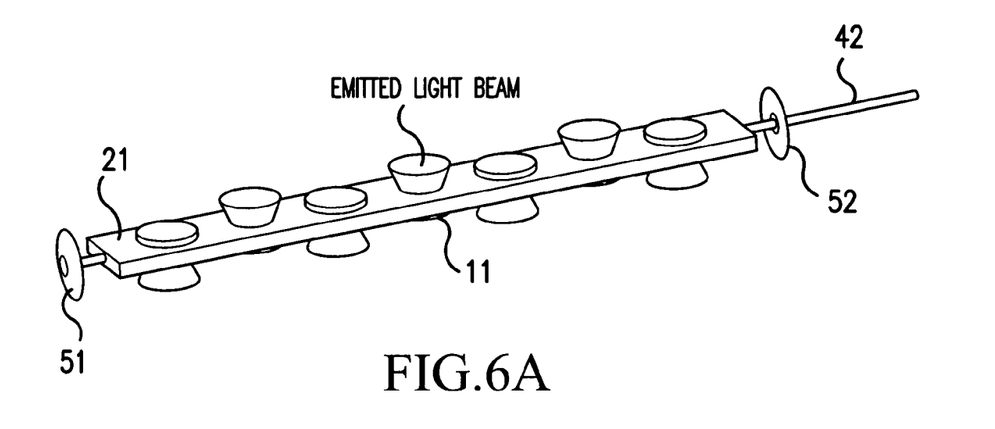
FIGS. 6A and 6B show views of a third preferred embodiment of the high power laser light system.
Figure 6B:
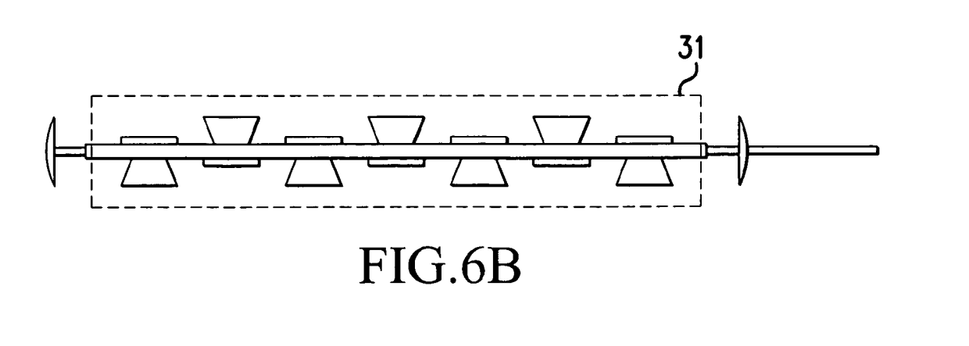

In a fourth preferred embodiment, VCSEL arrays are staggered on both surfaces of the laser gain crystal slab such that an area of the slab covered by a VCSEL array on one side is within an area not covered by VCSEL arrays on the opposite surface. Each surface having VCSEL arrays is within the current flow. FIGS. 6A and 6B show views of an arrangement for the second preferred embodiment. Similar to the first preferred embodiment, substantially the entire area of the slab laser gain crystal is covered based on the arrangement on both opposing surfaces, while cooling is sufficiently accomplished for heat dissipated from diodes and laser gain crystal.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An integrated laser light emission system, comprising:
   a laser gain medium having at least one surface including an exposed region; and
   a plurality of vertical-cavity surface-emitting laser diode arrays, each said laser diode array having a mount for mounting said respective laser diode array to the at least one surface of the laser gain medium and aligned with a respective said exposed region,
   wherein no intervening lens elements are contained between light sources of the vertical-cavity surface-emitting laser diode arrays and the laser gain medium, and
   wherein an area of the exposed surface of the laser gain medium is greater than the cross section dimension of the light beam emitted by each respective vertical-cavity surface-emitting laser diode array,
   wherein said mount mounts the vertical-cavity surface-emitting laser diode arrays in a junction-down position to the laser gain medium such that electrodes of respective vertical-cavity surface-emitting laser diodes face a surface of the laser gain medium,
   wherein said mount elevates the electrodes of respective vertical-cavity surface-emitting laser diode arrays over the laser gain medium providing a gap between the respective vertical-cavity surface-emitting laser diode array and laser gain medium sufficient for coolant to flow, and
   wherein low-loss diffuser plates seal the electrodes and the surface of each respective vertical-cavity surface-emitting laser diode array having the electrodes in order to protect the surface of each laser diode array from exposure to coolant.

2. The integrated laser light emission system of claim 1, wherein the laser gain medium is a rectangular slab having parallel top and bottom surfaces, the respective exposed region being in one of the top or bottom surface; and
   wherein an output laser light is output from a side surface, different from the top or bottom surface of the laser gain medium.

3. The integrated laser light emission system of claim 1, further comprising a single type of cooling system for cooling both the laser gain medium and the plurality of vertical-cavity surface-emitting laser diode arrays.

4. The integrated laser light emission system of claim 1, wherein the laser gain medium and plurality of vertical-cavity surface-emitting laser diode arrays are a single semiconductor chip for outputting laser light.

5. The integrated laser light emission system of claim 1, wherein the laser gain medium is a rectangular slab having parallel top and bottom surfaces, wherein the vertical-cavity surface-emitting laser diode arrays are mounted on each of the top and bottom surfaces of the laser gain medium in a staggered arrangement, the staggered arrangement is such that the space between each adjacent pair of vertical-cavity surface-emitting laser diode arrays on the top surface is substantially covered by a vertical-cavity surface-emitting laser diode array on the bottom surface of the laser gain medium.

6. The integrated laser light emission system of claim 1, wherein the vertical-cavity surface-emitting laser diode arrays are junction-down mounted to the laser gain medium via a conductive adhesive.

7. The integrated laser light emission system of claim 1, wherein the laser gain medium is without a pump cavity such that the mount of each respective vertical-cavity surface-emitting laser diode is directly mounted to the surface of the laser gain medium without the pump cavity.

8. The integrated laser light emission system of claim 1, wherein a single cooling system produces a flow of coolant in the gaps between the respective vertical-cavity surface-emitting laser diode arrays and laser gain medium, as well as over a surface of the vertical-cavity surface-emitting diode arrays on an opposite side from said gaps facing away from the laser gain medium.

9. An integrated laser light emission system, comprising:
   a laser gain medium having a cavity including an exposed region and a reflective region;
   a plurality of semiconductor laser diode arrays mounted to the laser gain medium and aligned with said exposed region; and
   a single cooling system, wherein said single cooling system produces a flow of a coolant,
   wherein no intervening lens elements are contained between the semiconductor laser diode arrays and the laser gain medium, and
   wherein an area of the exposed region of the laser gain medium is greater than the cross section dimension of the light beam emitted by a semiconductor laser diode array,
   wherein the single cooling system provides the flow of coolant to the reflective region of said cavity of the laser gain medium and to a rear surface of the semiconductor laser diode arrays opposite to the surface that emits light, and does not provide the flow of coolant to the exposed region and to the surface of the semiconductor laser diode arrays that emits light.

* * * * *